United States Patent [19]
Baer et al.

[11] Patent Number: 5,709,100
[45] Date of Patent: Jan. 20, 1998

[54] AIR CONDITIONING FOR COMMUNICATIONS STATIONS

[75] Inventors: Daniel B. Baer, Delaware; Frank E. DiPaolo, Dublin; Stephen C. Sillato, Westerville; David A. Dukes, Powell, all of Ohio

[73] Assignee: Liebert Corporation, Columbus, Ohio

[21] Appl. No.: 705,430

[22] Filed: Aug. 29, 1996

[51] Int. Cl.⁶ ......................................... F25D 23/12
[52] U.S. Cl. ..................... 62/259.2; 62/428; 62/411; 62/412
[58] Field of Search ..................... 62/259.1, 259.2, 62/298, 426, 428, 407, 408, 409, 411, 412, 175, 186

[56] References Cited

U.S. PATENT DOCUMENTS

| | | | |
|---|---|---|---|
| 2,350,886 | 6/1944 | Friemann | 62/6 |
| 2,796,743 | 6/1957 | McFarlan | 62/117.6 |
| 2,941,373 | 6/1960 | Simmons | 62/7 |
| 2,942,154 | 6/1960 | Ryan | 317/22 |
| 2,958,211 | 11/1960 | Griffith | 62/402 |
| 2,963,879 | 12/1960 | Paravicini | 62/239 |
| 3,059,448 | 10/1962 | McCorath | 62/203 |
| 3,500,655 | 3/1970 | Lyons | 62/186 |
| 4,462,460 | 7/1984 | Braver | 165/26 |
| 4,543,796 | 10/1985 | Han et al. | 62/160 |
| 4,726,197 | 2/1988 | Megrditchian | 62/309 |
| 5,036,677 | 8/1991 | Neuenfeldt et al. | 62/259.1 |
| 5,142,883 | 9/1992 | DeWitt | 62/298 |
| 5,144,816 | 9/1992 | Chase | 62/408 |
| 5,253,484 | 10/1993 | Corman et al. | 62/239 |

FOREIGN PATENT DOCUMENTS

| | | | |
|---|---|---|---|
| 766015 | 8/1967 | Canada | 62/259.1 |

OTHER PUBLICATIONS

Liebert Intelecool Guide Specifications for 2–5 Ton Precision Environmental Control . . . .

*Primary Examiner*—William Doerrler
*Attorney, Agent, or Firm*—Mueller and Smith, LPA

[57] ABSTRACT

A redundant, dual circuit air conditioning apparatus is provided for communications enclosures which is wall mounted thereon. A conditioned air housing is provided having a blower chamber which contains two air circulation blowers thrusting air into the enclosure and having freely pivotal ducts which operate in mutual cooperation in response to pressure variations between the chamber and the enclosure. Internested evaporator coils of two discrete refrigeration circuits share common fin connections for efficiency and each includes a dual line input performing in conjunction with an expansion valve and a simple Y distribution fitting coupled to those lines which achieves requisite pressure drops at low cost. Compressor and condenser components are located within a condenser system housing in mutual isolation and perform in conjunction with discrete separate power inputs and controls such that servicing may take place safely upon one air conditioning entity while the other remains in operation to prevent down time during servicing.

16 Claims, 6 Drawing Sheets

AIR CONDITIONING FOR COMMUNICATIONS STATIONS

BACKGROUND OF THE INVENTION

As the information age progresses with the expansion of visual, textual, and vocal media, a substantially expanded supportive infrastructure has been called for. For example, the field of telecommunications has evolved a cellular market segment which is rapidly expanding both in the developed nations as well as in the third world. To support cellular systems, cellular towers and supporting communications devoted switching equipment are commonplace. The latter electronic equipment is seen to be housed in base stations which generally are prefabricated and delivered intact at a tower site. For the most part, the stations perform unattended by communications personnel. Because of the environmental sensibility of the equipment contained within the stations and the noted unattended nature of such facilities, the prefabricated building structures typically incorporate redundant, single circuit air conditioning units. Such air treatment units typically have been in the one to five ton capacity range and are mounted in a spaced apart orientation at one wall of a base building. Such spacing is required to provide access to the mechanisms for service personnel. Redundancy is required to assure maintenance of proper environmental temperatures, alarm conditions typically being encountered as the station temperatures reach about 85°–90° F.

An emerging component of the cellular market segment is concerned with Personal Communications Systems (PCS). These PCS systems employ local cellular networks which perform at different frequencies and bandwidths, and heretofore utilize and employ smaller, but more geographically closely spaced sending and receiving stations. As such, the supporting unattended base structures or enclosures are relatively smaller. Accordingly, their cooling load requirements are smaller, being in the 1 to 1 ½ ton capacity range. Because of the relatively diminutive size of the base enclosures, space for dual air conditioning units is restricted and servicing access is difficult to achieve where two individual redundant units are employed. Additionally, resort to two separate air conditioning units poses an unwanted cost consequence to communications providers.

SUMMARY

The present invention is addressed to a communications system of a variety involving a ground supported enclosure carrying electronic equipment, for example, for telecommunications purposes. That equipment both exhibits a heat load and requires a controlled environmental temperature in order to sustain operation. Such enclosures recently have tended to be of smaller or diminutive size requiring air conditioning systems not only of lesser capacity but also exhibiting wall surface areas of such diminished size as not to pose footprint difficulties with respect to the traditional installation of two separate air conditioning units. With the present invention, air conditioning apparatus is provided which develops needed dual and discrete air conditioning and electrical control circuit redundancy while remaining of a size exhibiting an acceptable "footprint" for wall mounting. Further the apparatus remains serviceable typically without conditioned air production down time. By a unique interassociation of operational functions, the redundant air conditioning entities of the apparatus function to so mutually interact as to achieve certain efficiencies in both mechanical operation and refrigeration efficiency.

Two separately powered blowers are employed with the apparatus which are retained within a conditioned air housing having a blower chamber located adjacent an air transfer port formed within a wall of the enclosure being supported. Utilizing the relatively slight pressure drop exhibited by one of the operating blowers within this chamber, an airborne actuation of freely hinged dampers is achieved to provide for all requirements of alternate and simultaneous operation of the blowers without resort to discrete driving appliances and the like for the dampers. Through the utilization of internested and common fin connected evaporation coils, efficiencies are achieved in refrigeration performance. As another aspect of the apparatus, the compressor, condenser coils, and condenser fans are retained within a condenser system housing with such components for each air conditioning entity being mutually isolated to permit the safe servicing of one while the other remains energized and active. Through the selection of expansion devices for each of the discrete and separate refrigeration circuits in conjunction with a dual line distribution fitting, appropriate pressure drops are achieved leading to the evaporation coils without resort to expensive distributors and the like otherwise required.

The apparatus also works in conjunction with ambient air when that ambient air achieves appropriate lower temperature conditions. This feature is combined in unitary fashion with the existing redundant system to achieve operational and manufacturing economies. For safety purposes, the control system of the apparatus is divided into discrete power circuits, high voltage and thus service hazard invoking components which are mounted in spaced apart relation such that those components remaining active during servicing are isolated from personnel. Correspondingly, those lower voltage control components for each of the systems are made available to personnel without substantial hazard being encountered.

As another feature, the invention looks to a communications system having a ground supported enclosure for retaining electronic equipment exhibiting a given heat load and having a wall with an air transfer port for cooperating with an air conditioning system. The system includes an improved air conditioning apparatus which has a conditioned air housing mountable upon the wall of the enclosure with a blower chamber located adjacent the air transfer port. The condenser system housing which is mountable upon the enclosure wall and first and second air circulation blowers are mounted within the blower chamber having respective first and second input ports located within the blower chamber and respective first and second air output ports positioned in air output communication with the wall air transfer port. First and second motors are provided which are selectively energizable to respectively drive the first and second air circulation blowers to transfer air from the blower chamber through the air transfer port while effecting an air pressure drop at the blower chamber. First and second dampers are pivotally mounted at the respective first and second output ports, the first damper having a closed orientation blocking air transfer from the enclosure through the first air output port when the first motor is de-energized and the second motor is energized. The first blower has an open orientation when the first motor is energized. The second damper has a closed orientation blocking air transfer from the enclosure through the second air output port when the second motor is de-energized and the first motor is energized, and has an open orientation when the second motor is energized. A first refrigeration circuit is provided having a first condenser coil, a first expansion device, a first compressor energizable to compress refrigerant, and a first evaporator coil, the first evaporator coil being located within the blower chamber in heat transfer association with air passing through the air transfer port and the first condenser coil being located within the condenser system housing. A first condenser fan is located within the condenser system housing and a third motor is located within the condenser system housing and energizable to drive the first condenser fan to effect passage of ambient air across the first condenser coil. A second refrigeration circuit is provided having a second condenser coil, a second expansion device, a second compressor energizable to compress refrigerant, and a second evaporator coil, the second evaporator coil being located within the blower chamber in heat transfer association with air passing through the air transfer port and the second condenser coil being located within the condenser system housing. A second condenser fan is located within the condenser system housing and a fourth motor is located within that condenser system housing and is energizable to drive the second condenser fan to effect passage of ambient air across the second condenser coil. A control system responds to an applied source of power for energizing the first and third motors and the first compressor in response to an alarm condition or an increased load condition to energize the second and fourth motor and the second compressor.

As another feature, the invention looks to a communications system having a ground supported enclosure for retaining electronic equipment exhibiting a given heat load and having a wall with an air transfer port for cooperating with an air conditioning system, the improved air conditioning apparatus including a conditioned air housing mounted upon the wall having a blower chamber located adjacent the air transfer port and a condenser system housing mounted upon a wall in mutually close adjacency with the conditioned air housing. First and second air circulation blowers are mounted within the blower chamber having respective first and second input ports and respective first and second output ports positioned in air input communication with the wall air transfer port. First and second motors are selectively energized to drive the first and second air circulation blowers. A first refrigeration circuit is provided having a first condenser coil, a first expansion device, a first compressor energizable to compress refrigerant, and a first evaporator coil. The evaporator coil is located adjacent the air transfer port at the blower chamber and the first condenser coil and first compressor are located in a condenser system housing. A first condenser fan is located within the condenser system housing and a third motor is located at the condenser system housing and is energizable to drive the first condenser fan to effect passage of ambient air across the first condenser coil. A second refrigeration circuit is provided having a second condenser coil, a second expansion device, a second compressor energizable to compress refrigerants, and a second evaporator coil. The second evaporator coil is located adjacent the air transfer port at the blower chamber in internested relationship with the first evaporator coil and includes heat transfer fins in common connection with the first and second evaporator coils. A second condenser fan is located at the condenser system housing and a fourth motor is located within the condenser system housing and is energizable to drive the second condenser fan to effect passage of ambient air across the second condenser coil. A control system responds to an applied source of power for energizing the first and third motors and the first compressor, and is responsive to an alarm condition or an increased load condition to energize the second and fourth motors and the second compressor.

Another feature of the invention provides a communication system with a ground supported enclosure for retaining electronic equipment exhibiting a given heat load and having a wall within an air transfer port for cooperating with an air conditioning system. An air conditioning apparatus is provided having a conditioned air housing mountable upon a wall having a blower chamber located adjacent the air transfer port. A condenser system housing is mountable upon the wall and has first and second mutually isolated regions. First and second air circulation blowers are mounted within the blower chamber, having respective first and second input ports and respective first and second output ports positioned in air communication with the wall air transfer port. First and second motors are selectively energized to drive the first and second air circulation blowers. A first refrigeration circuit is provided having a first condenser coil, a first expansion device, a first compressor energizable to compress refrigerant, and a first evaporator coil. The first evaporator coil is located adjacent the air transfer port at the blower chamber and the first condenser coil and the first compressor are located at the first region of the condenser system housing. A third motor is located a the first region of the condenser system housing and is energizable to drive the first condenser fan to effect passage of ambient air across the first condenser coil. A second refrigerator circuit is provided having a second condenser coil, a second expansion device, a second compressor energizable to compress refrigerant, and a second evaporator coil. The second evaporator coil is located adjacent the air transfer port at the blower chamber and the second condenser coil and second compressor are located at the second region of the condenser system housing. A second condenser fan is located at the second region of the condenser system housing and a fourth motor is located at the second region of the condenser system housing and is energizable to drive the second condenser fan to effect passage of ambient air across the second condenser coil. A control system is provided which is connectable with a source of power and has a first power circuit including a first principal power switch actuable to enable passage of electric current at drive voltage levels to the first and third motors and the first compressor. A first control network is provided which is operable at a control voltage level less than the drive voltage levels and includes first actuator components responsive to first control inputs for selectively effecting the energization of the first compressor and the first and third motors. A second power circuit is provided including a second principal power switch actuable to enable passage of electrical current at the chive voltage levels to the second and fourth motors and second compressor. A second control network is provided which is operable at a control voltage level less than the drive voltage levels and includes second actuation components responsive to second control inputs for selectively effecting the energization of the second compressor and the second and fourth motors. The first power circuit is mounted within a first maintenance accessible compartment and the second power circuit is mounted within a second maintenance accessible compartment while the first and second control networks are spaced from the first and second compartments.

Other objects of the invention will, in pan, be obvious and will, in part, appear hereinafter.

The invention, accordingly, comprises the system and apparatus possessing the construction, combination of elements, and arrangement of pans which are exemplified in the following detailed description.

For a fuller understanding of the nature and objects of the invention, reference should be had to the following detailed description taken in connection with the accompanying drawings.

DETAILED DESCRIPTION

Figure 1:
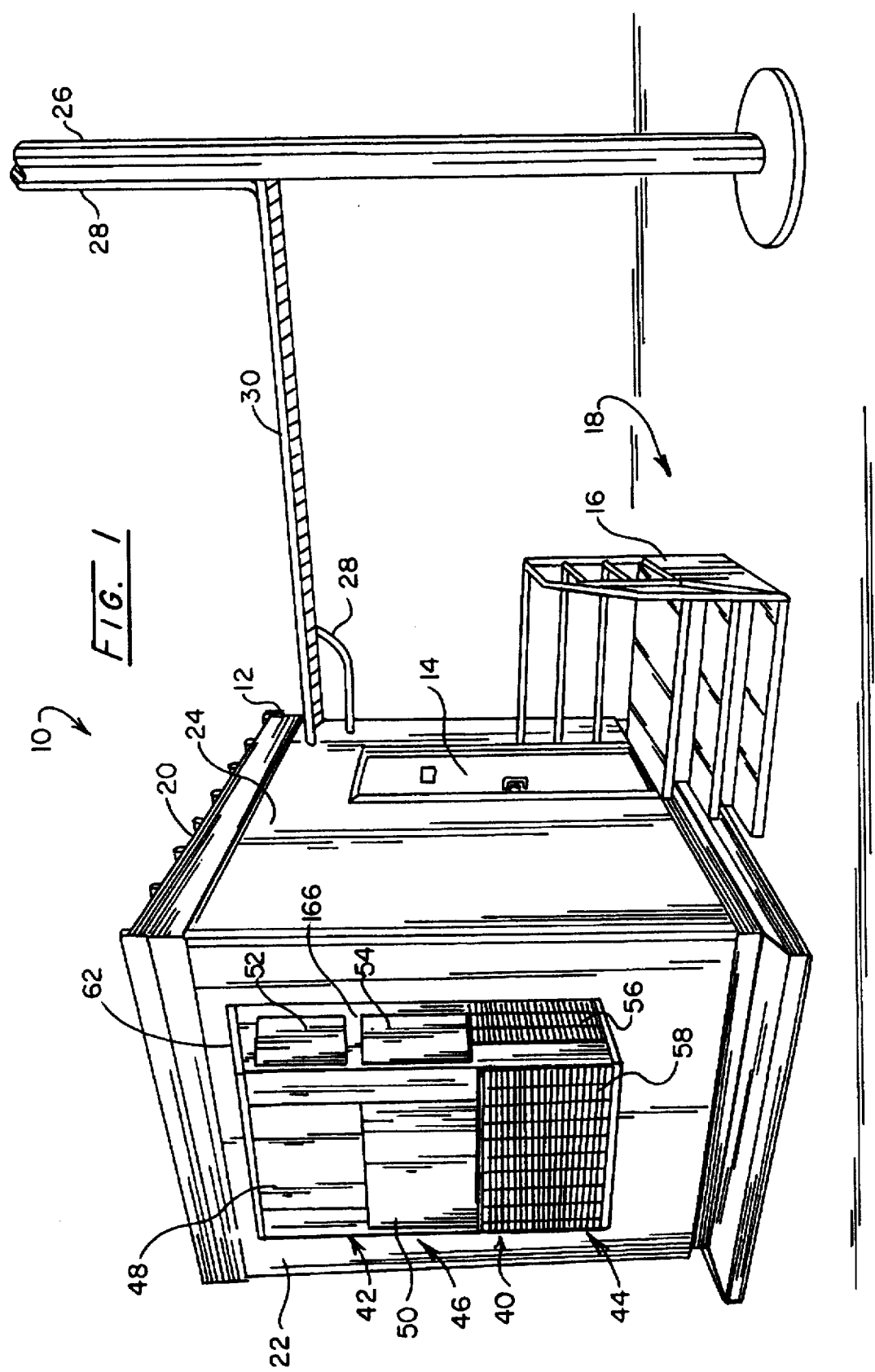
FIG. 1 is a perspective view of a communications enclosure incorporating air conditioning apparatus according to the invention.

Referring to FIG. 1, an embodiment of a communications system according to the invention is represented generally at 10. System 10 includes a somewhat diminutive base station building or enclosure 12 which generally will have been prefabricated and delivered to a site by truck. The enclosure 12 includes an access door 14 for entry by service personnel and a stairway 16 leading thereto. Enclosure 12 is supported upon ground represented at 18 and is secured from the weather or environment by a roof 20. Two walls as at 22 and 24 are revealed forming a portion of the structure 12 and the electronic equipment contained therein performs in conjunction with receiving and transmitting antenna components supported upon a mast or tower represented at 26 via cable communication as represented by a cable 28 supported by a small bridging structure 30. Electronic switching equipment and the like in operation with the enclosure 12 will present a given heat load requiring the development of conditioned air to maintain the temperature within enclosure 12 within defined limits. In this regard, alarm conditions may occur typically as the internal temperature of the enclosure 12 reaches about 85° to 90° F. Because of the need to assure continued performance of the telecommunications equipment within enclosure 12, it is necessary that internal environmental temperature for proper performance be assured and such assurance generally calls for the use of redundant air conditioning equipment. However, with smaller cellular systems such as PCS systems incorporating enclosures 12 of relatively small size, dual air conditioning systems are not practical and represent a cost which is relatively high with respect to the overall cost of the system 10. Further, the mounting of two systems upon a wall of the enclosure 12, for example upon wall 22, is problematic, inasmuch as there must be room or space between adjacent air conditioning modules to achieve adequate maintenance or repair by service personnel. The present invention achieves that called for assurance of reliability through redundancy while minimizing the space or wall footprint required by such apparatus and while achieving simplified access for maintenance personnel.

The improved air conditioning apparatus according to the invention is represented generally at 40. Apparatus 40 is positioned against an air transfer port or opening (not shown) formed within wall 22 which may be dimensioned, for example, as a rectangular opening having a width of about 28 inches and a height of about 30 inches. Apparatus 40 is sealed against the weather and with respect to the noted air transfer port and is generally formed having two principal housing portions, an upwardly disposed conditioned air housing represented generally at 42 and an adjacently disposed lower condenser system housing represented generally at 44. The outwardly facing surface of apparatus 40 as represented generally at 46 is formed having an access panel 48 and removable box-like ambient air intake structure 50 which service personnel may remove for servicing the components therewithin. Additionally, side panels for service access may be provided, two of which are seen at 52 and 54. The condenser system housing 44 is enclosed by air access gates, two of which are revealed at 56 and 58.

Apparatus 40 contains two separate air conditioning entities with two distinct and separate refrigeration circuits. These entities are combined, however, to achieve a cost savings over typical redundant units. Further, serviceability is provided by ready access to components for servicing personnel. In particular, to assure no down time in the telecommunications equipment involved within the enclosure 12, personnel may carry out the maintenance of one of the air conditioning entities while the other remains in operation without incurring risks due to working around energized moving equipment or near high voltage level power inputs.

Figure 2:
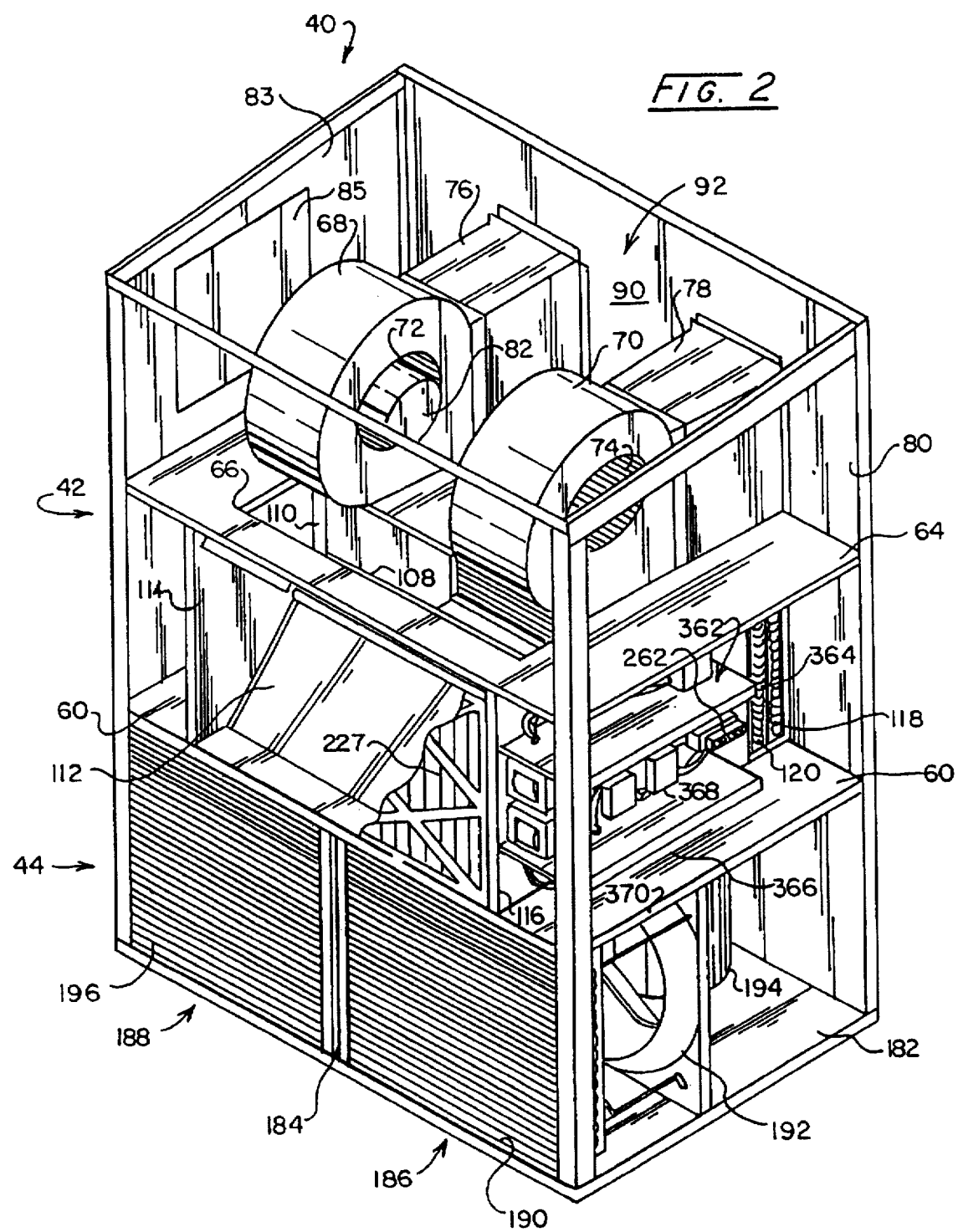
FIG. 2 is a perspective view of the apparatus shown coupled to the enclosure in FIG. 1 with portions broken away to reveal internal structure.
Figure 5:
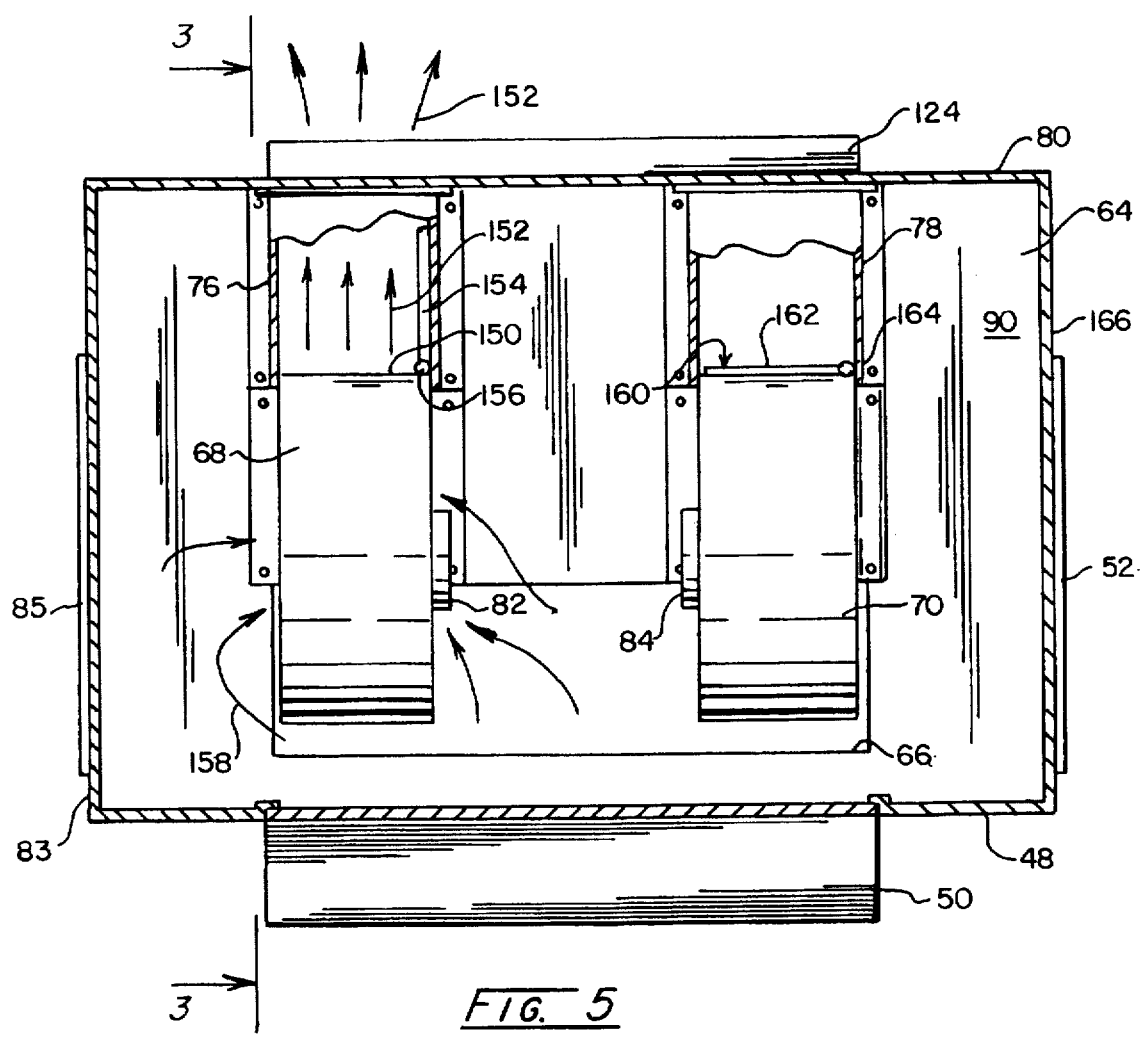
FIG. 5 is a sectional view taken through the plane 5—5 shown in FIG. 3.

Referring to FIG. 2, internal details of the apparatus 40 are revealed in conjunction with a frame-like support structure. It may be appreciated that a variety of support designs may be employed with apparatus as at 40 to establish its outwardly viewed facade. The conditioned air housing 42 is seen to include a sheet metal floor 60, a roof 62 (FIG. 3) and an intermediate floor 64. An elongate rectangular air flow opening 66 is formed within the intermediate floor 64 and floor 64, in turn, is seen to support two spaced apart squirrel cage-like air circulation blowers or fans 68 and 70. Each of the blowers 68 and 70 have generally centrally located input ports shown, respectively, at 72 and 74, and corresponding output ports extending into respective air ducts 76 and 78. Ducts 76 and 78 are seen to be coupled with a rear sheet metal side 80. Cooperating with the rear sheet metal side 80 is a sheet metal side 83 with an access panel 85 positioned thereon. Blowers 68 and 70 are driven at their input port region by respective electric motors 82 and 84, the latter of which is shown in FIG. 5.

Air circulation blowers 68 and 70 are located within a blower chamber forming part of the conditioned air housing 42. Looking additionally to FIG. 3, this blower chamber is represented generally at 90 and includes an upper, air input region represented generally at 92 and a lower draw through region represented in general at 94 in FIG. 3, the opening 66 providing air flow communication between these two regions 92 and 94. In the view represented at FIG. 3, the region 94 is secure by virtue of the closure of a movable ambient air damper 96 which extends across apparatus 40 and pivots about the axis of a horizontal shaft 98. In the orientation shown, the damper 96 is blocking an elongate rectangular opening 100 within an angularly oriented transversely extending sheet metal baffle 102. Similarly, the damper 96 blocks an elongate rectangular opening 104 within an angularly oriented elongate transverse baffle 106. This permits air circulation or air flow through an elongate rectangular opening 108 within a vertically oriented elongate transverse sheet metal baffle 110 depending from the intermediate floor 64. Finally, a transversely extending, angularly oriented sheet metal baffle 112 extends across lower region 94. FIG. 2 reveals that baffle 112 extends between two intermediate sidewalls 114 and 116 extending, in turn, between sheet metal floor 60 and intermediate floor 64.

Figure 3:
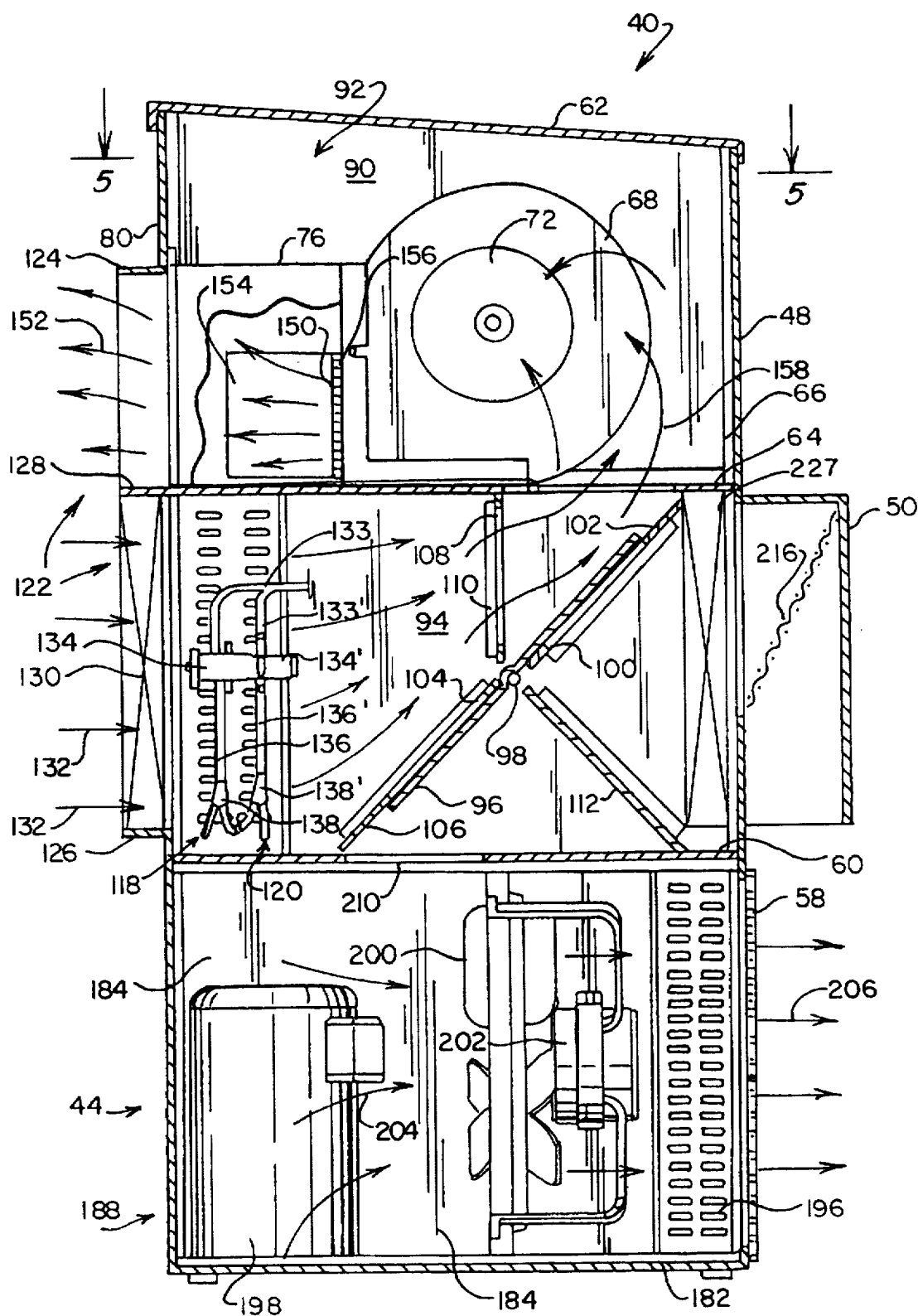
FIG. 3 is a sectional view taken through the plane 3—3 shown in FIG. 5.

FIG. 3 reveals the evaporator coils for two discrete refrigeration circuits employed with the apparatus 40. These two evaporator coils are represented in FIG. 3 at 118 and 120. Coil configurations 118 and 120 extend across a rearwardly disposed rectangular opening within fan chamber 90 represented generally at 122. Opening 122 is configured within a rearwardly extending rectangular cowling upper and lower components of which are seen in FIG. 3, respectively, at 124 and 126 with an intermediate extension of floor 64 at 128. Between extension 128 and lower cowling, portion 126, there is positioned a replaceable filter represented at 130 and the arrows as at 132 reveal that the blower chamber 90 carries out a draw through form of air circulation wherein air is drawn from the enclosure 12 through the coil configurations. 118 and 120, and thence into the lower region 94 of the lower chamber. Looking more particularly to the evaporator coil components of one refrigeration circuit, refrigerant under pressure is introduced via a line 133 to an expansion device 134. Upon being expanded at that device, for instance, a valve 134, the refrigerant passes via line 136 to a "pants" or Y-style coupling 138 to provide a bifurcate input to two separate evaporator coil conduit lines within the structure 118. This arrangement achieves requisite pressure drop at advantageously low expense. In this regard, the arrangement achieves proper pressure drop at the evaporator coil stage without resort to rather expensive distributors, the performance of the expansion device or valve 134 being adequately stable as it operates in conjunction with the simple Y-coupling 138 and two coil associated distribution lines. In effect, a smaller, hence less expensive, expansion device may be employed. Evaporator coil structure 120 performs identically and thus the components above described leading thereto are represented by the same numeration but in primed fashion.

Because of the logic of operation of the apparatus 40, in general, only one refrigeration system is employed at a time. Thus, advantage is taken with the present system of an arrangement wherein the coil structures 118 and 120 share the same heat transfer fins, thus developing an improved efficiency for the typical operation of apparatus 40. Expansion valves as at 134 and 134' may be provided, for example, as Model FBVE-1-GA-BP10 marketed by Sporlan Valve Co.

Blower chamber 90 provides for the draw through performance of the dual system at hand. In this regard, FIG. 3 reveals an air flow wherein air is thrust, for example by blower 68, into the enclosure 12 from the blower's output port represented generally at 150 and which is seen to be located with duct 76. The air flow from blower 68 is represented by arrows as at 152 and that air flow is seen to be exiting from output port 150 through an open damper 154. Damper 154 is vertically oriented and freely pivotal about the vertical axis of a hinge 156 located adjacent the output port 150. With the arrangement shown, circulating air is thrust or thrown by the blower 68 into the enclosure 12 as represented by arrows 152. The input port 72 of blower 68 draws in return air as represented by arrows as at 158 to provide a slight pressure drop within the blower chamber 90 therefore evoking a draw through form of return air distribution through the internested evaporator coil structures 118 and 120 as represented at arrows 132. This provides for a more efficient distribution of air across the coil structures 118 and 120. Such an arrangement wherein the active air circulation blower as at 68 is "throwing" air into the enclosure 12, while return air is being drawn through the coil structures 118 and 120 assures that there is no short circuiting of air movement from the output of the blower 68 directly back through the coil structures 118 and 120. There are no specific motor drives biasing the damper 154, it being opened by virtue of the blower derived air flow as represented at arrow 152. With the orientation shown, the blower chamber 90 is secure, no ambient air being permitted to be inserted within the system by virtue of the orientation of transverse damper 96.

Assuming for the instant demonstration that the blower 68 is of the secondary air cooling entity and that adjacent air circulation blower 70 is deactivated, then it is necessary that the output port of blower 70 be blocked. Looking to FIG. 5, the arrangement by which air flow derived opening and closing of the output ports of air circulation blowers 68 and 70 occurs is revealed. In the figure, it is again assumed that blower 68 is energized and driving air as represented by arrows 152. Under normal circumstances, the blower 70 will be de-energized during such energization of blower 68. The output port of blower 70 is seen in FIG. 5 in general at 160. Output port 160 is closed by a damper 162 mounted within duct 78. In this regard, as in the case of damper 154, damper 162 is freely pivotally mounted about a vertical hinge 164. With the arrangement shown, with the energization of blower 68, a slight pressure drop will be experienced within blower chamber 90 and a slight pressure increase will be observed at the enclosure 12. Resilient air movement forces the damper 162 into the closed orientation shown. However, should blower 70 be energized, then the damper 162 will be open and remain open by virtue of air flow. Should blower 68 be de-energized during such period, then the same air flow phenomenon will cause the closure of damper 154 across port 150. FIG. 5 further reveals the completed securement of chamber 90 by a side panel 166 which is seen supporting the earlier-described access panel 52.

Figure 6:
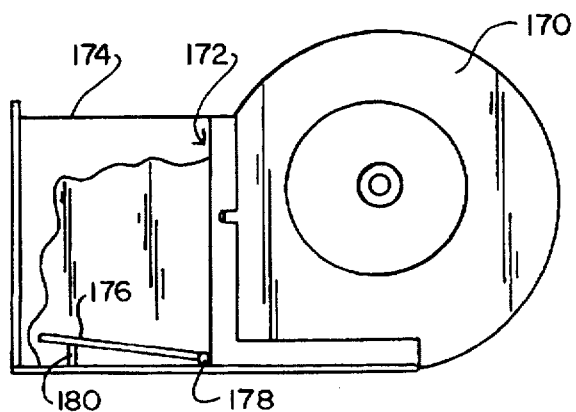
FIG. 6 is a side view showing an alternative freely-pivoted damper arrangement for an air circulation blower with portions broken away to reveal internal structure.

The noted freely pivotal mounting of the dampers 154 and 162 about a substantially vertical axis is the preferred arrangement for this function. One alternate arrangement for the damper mounting is at a horizontal axis located adjacent a lowermost surface of the output ports of the blowers. Looking momentarily to FIG. 6, an air circulation blower is represented at 170 having an output port represented generally at 172 located within a duct 174, an arrangement identical to that associated with blowers 68 and 70. However, for the present embodiment, a damper 176 is seen to be freely pivoted about a horizontal axis at a hinge 178 located at the bottom of output port 172. To assure closure of the damper 176 about hinge 178, when the blower 170 is de-energized and the corresponding second entity blower is energized, a small stand-off or the like 180 is mounted within the bottom of duct 174 to provide a slight angle of attack with respect to damper 176 to enhance its pivoting about hinge 178 into a closed position blocking output port 172.

Returning to FIG. 2, the condenser system housing 44 is seen to extend between the sheet metal floor 60 and a bottom sheet metal floor 182. The housing 44 is integrally formed with the apparatus 40 and incorporates a center sheet metal barrier represented at 184 which physically isolates one side of the housing 44 from the other. For example, FIG. 2 reveals in lieu thereof two regions as at 186 and 188. Within region 186, there is located a condenser coil 190, a condenser fan 192, and the motor driven compressor 194 for one air conditioning entity. A similar grouping of components is within region 188, such components including a second discrete condenser coil 196. By dividing the two air conditioning entities between regions 188 and 186, personnel may carry out service on the de-energized components within one region, while the components in the opposite or adjacent region are in full operation, thus assuring safety for servicing personnel and eliminating any down time of the important system.

Returning to FIG. 3, the components mounted within region 188 of condenser system housing 44 are depicted. In the figure, a compressor for compressing refrigerant is represented at 198. Condenser coil 196 reappears in conjunction with a condenser fan 200 driven by a motor 202. With the arrangement of FIG. 3, in normal operation, air flow is through side gates under the impetus of fan 200 and thence through the coil structure 196 as represented by arrows 204 and 206.

Where ambient temperatures are sufficiently low, i.e. about 55° F., the apparatus 40 is capable of performing requisite cooling utilizing that ambient air to the exclusion of its refrigeration based systems.

Figure 4:
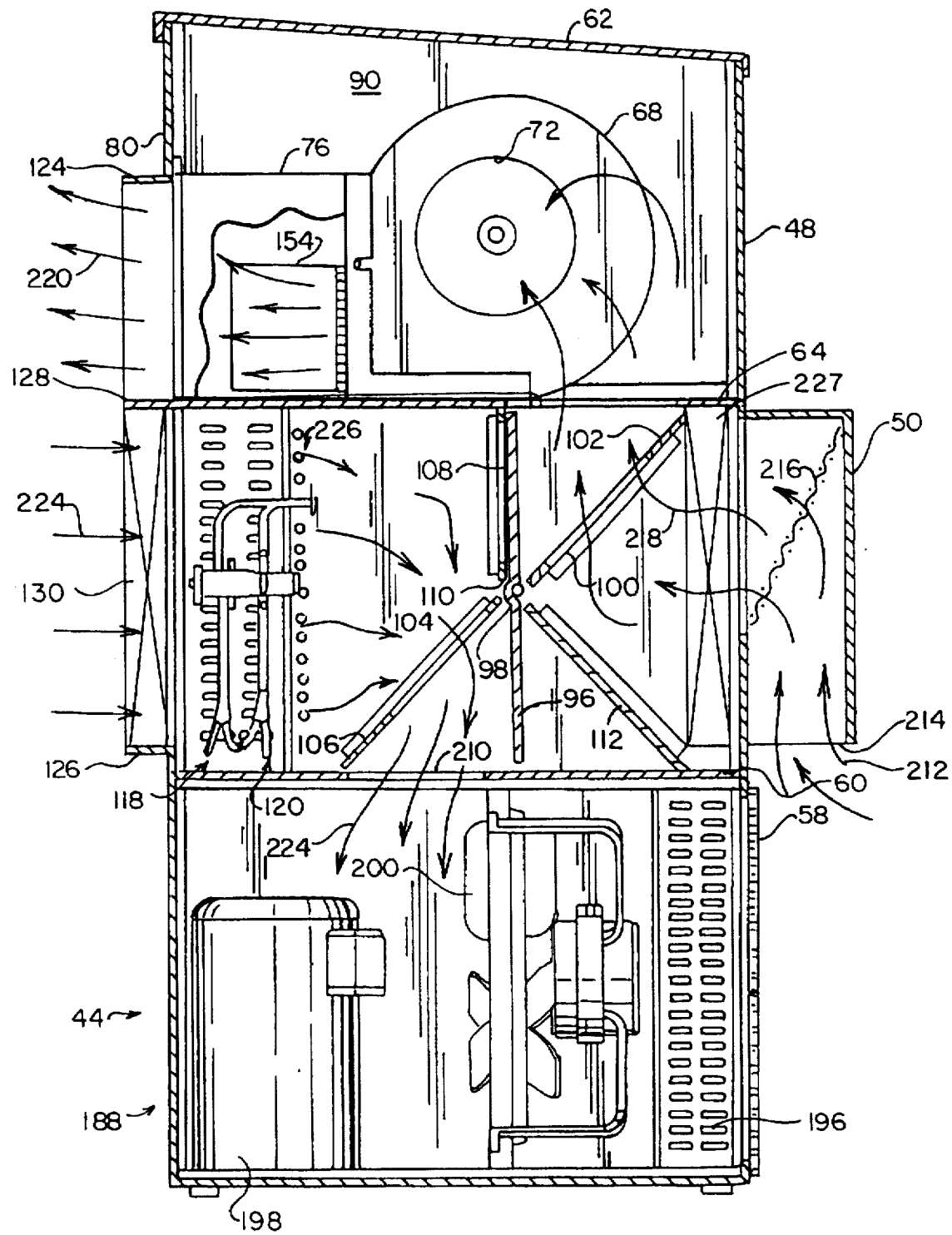
FIG. 4 is a sectional view taken through the plane 3—3 shown in FIG. 5 and showing an orientation of a damper for utilizing ambient air input.

Turning to FIG. 4, the components earlier described in connection with FIG. 3 are revealed but with the exception that the elongate transversely mounted damper 96 has now been moved about its axis or shaft 98 to an orientation permitting the movement of a maximum amount of ambient air into the system. In this regard, it may be observed that the damper 96 has an essentially vertical orientation closing the opening 108 of baffle 110, and removing the earlier-noted blockages of opening 100 within transversly oriented baffle 102. Additionally, it may be observed that opening 104 within baffle 106 is open to permit air transfer through an opening 210 in floor 60. In general, the damper 96 is moved and retained at desired orientations by a damper motor (not shown). Such damper motors may be provided, for example, as type ML6185A marketed by Honeywell. With the energization, for example, of blower 68, and the noted orientation of damper 96, air flow may be provided from the ambient surrounding as represented by arrows 212 showing ambient air entry through a downwardly disposed opening 214 within box-like structure 50. The air progresses through a vermin guard or grid 216, as represented by arrows as at 218 through the opening 100 and into the input port 72 of blower 68. Blower 68, in turn, provides a forced air output as represented at arrows 220. Note that the air input to the blower input port 72 is caused to pass through a filter 227 immediatley adjacent the structure 50. Return from the enclosure 12 is as represented at arrows 224 through the coil structures 118 and 120 which are now de-activated, thence, as represented at arrows 224 through an opening 210 in floor 60 and thence through the gate structures 56 and 58 at the condenser housing 44. Temperature control for this arrangement utilizing ambient air may be effected or temperatures modulated by selective pivotal movement of the damper 96 to differing orientations. In this regard, as the damper is moved clockwise in the sense of FIG. 4, the opening 108 within baffle 110 may be progressively uncovered to provide a modicum of recirculation of this air.

Air directed to enclosure 12 may be heated by heater coils extending in parallel with evaporator coils 118 and 120 as represented generally at 226. Such an added feature serves to provide opportunity for a more accurate adjustment of air temperature towards a predetermined target value. The heater function may be employed with refrigeration activity as a dehumidifying feature.

Figure 7:
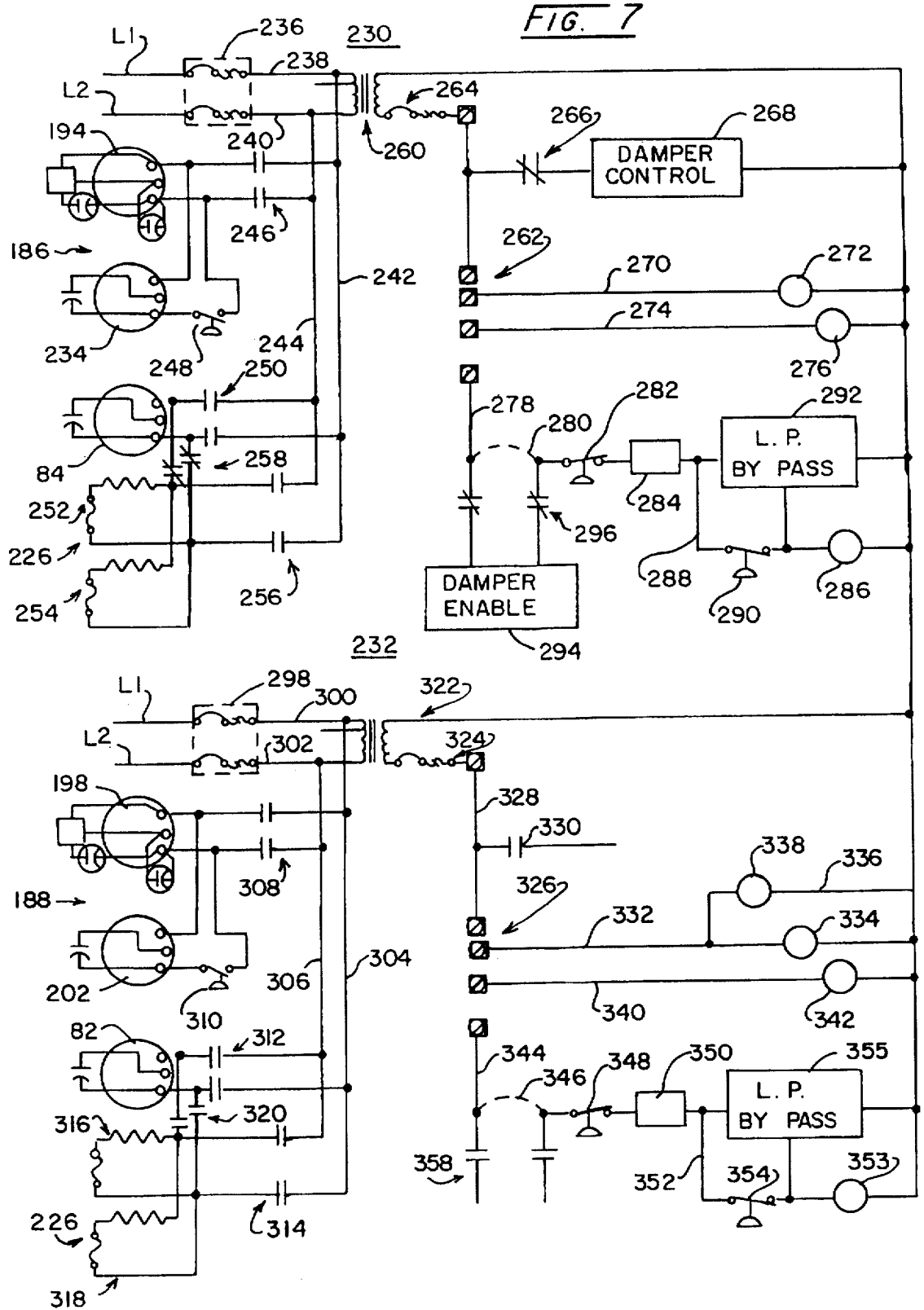
FIG. 7 is a schematic electrical diagram of control system components employed with the apparatus of FIG. 2.

As noted above, a salient feature of the apparatus 40 resides in an ability to isolate one air conditioning entity from the other for purposes of permitting service of one while the other is in frill operation. This feature, in addition to being reflected in the regional division as described at 186 and 188 in connection with FIG. 2, is reflected in the power input approach and control system approach. Referring to FIG. 7, the control and power input features of the apparatus are portrayed. For each air conditioning entity, separate power inputs are provided. In this regard, FIG. 7 reveals one of the power circuits shown in general at 230, while a second power circuit is represented in general at 232. Power circuit 230 functions, inter alia, to provide drive input current at higher voltage levels to the compressor 194, condenser motor 234, and blower motor 84. This will be seen to be the primary air treatment system. Correspondingly, a separate power input is provided to provide input current at higher voltage levels to compressor 198, a motor 202 for driving condenser fan 200, and blower motor 82.

Looking initially to circuit 230, power is supplied to the circuit via input lines L1 and L2 which are directed to a fused circuit breaker represented in block phantom form at 236. The circuit breaker 236 also may be utilized as a hand actuated on and off switch. The output from device 236 is provided at lines 238 and 240 to distribution lines shown, respectively, at 242 and 244. Lines 242 and 244 direct power through paired relay terminals or contactors represented generally at 246 both to compressor 194 and condenser fan motor 234. Compressor 194 is shown provided in conjunction with starting and run capacitors, while motor 234 is shown operating in conjunction with a running capacitor, as well as a fan cycling control switch 248.

Power distribution lines 242 and 244 also extend through paired contactors or relay contacts 250 to blower motor 84 which is seen performing in conjunction with a run capacitor.

Also powered from lines 242 and 244 are two discrete heater coil components of the heater coil structure 226 as represented in general at 252 and 254. Components 252 and 254 perform in conjunction with protective fusible links and are powered with the closure of paired relay contacts as shown at 256. Note, additionally, that normally closed paired contacts 258 are provided in conjunction with the heater components 252 and 254 and blower motor 84. With the actuation of contact pair 250 to a closed orientation, contacts 258 are energized to an open orientation. With the activation of the heating components 252 and 254 and closure of contacts 256, the blower motor 84 is energized through normally closed contact pair 258. Those contacts are opened at such time as the normal activating contact pair 250 are closed with respect to the blower 84.

Lines 238 and 240 from device 236 also extend to the primary side of a step down transformer 260 which provides a voltage transition to a control voltage level, for example 24 volts, for energizing control components. The type of control components employed with the apparatus 40 may be varied to suit the desires of the user. In this regard, to facilitate the coupling of any of a variety of logic or control systems, a terminal strip as represented generally at 262 is provided for facilitating connection to such control entities. The secondary side of transformer 260 is shown extending through a circuit breaker 264 to the noted terminal strip 262 as well as through normally closed contact or relay 266 to a damper control function represented at block 268. Function 268 carries out the maneuvering of damper 96 by virtue of inputs to a damper motor. Terminal strip 262 also shows connection via line 270 with a blower motor relay coil 272 functioning to operate in conjunction with contacts 250 and 258. Next, line 274 is seen to extend from the terminal strip 262 to a heater relay coil 276 which performs in conjunction with contacts 256.

Next, a line 278 is seen extending from the terminal strip 262 and through a jumper 280 to a high pressure protective switch 282 which performs in conjunction with compressor 194. When closed, this switch directs enabling current input to a compressor short cycle time delay represented at block 284 which delays a re-energization of the compressor 194 for a predetermined interval following its de-energization, for example, an interval of 3 minutes. Next, from the component 284, the system functions to activate a compressor contactor relay coil 286 via line 288. Within line 288 there is provided a low pressure cut-out switch 290 blocking the energization of coil 286 where low pressure conditions are at hand. However, to avoid malfunction where low ambient temperatures are present and low pressures are inherent, a low pressure bypass function is provided as represented at block 292 which permits the energization of coil 286 for a predetermined interval, notwithstanding the opening switch 290. As is apparent, the relay or coil at 286 performs in conjunction with contact pair 246.

Where ambient air is being employed to cool the enclosure 12 through the manipulation of damper 96, then jumper 280 will have been removed to activate a damper enable function represented at block 294. Control over the enabling function 294 additionally is made available by actuation of normally closed relay or contactor activated contact pair represented generally at 296.

Now looking to the control features of circuit 232, power input is seen to be directed from lines L1 and L2 through a fused circuit breaker functioning as a principal power switch as represented at block 298 to lines 300 and 302. Lines 300 and 302, in turn, lead to respective distribution lines 304 and 306. As before, lines 304 and 306 extend through relay contact pair 308 to compressor 198 and simultaneously to condenser fan motor 202. Compressor 198 operates in conjunction with start and run capacitiors as shown, while motor 202 performs in conjunction with a run capacitor and a fan cycling control switch 310. Lines 304 and 306 also extend through normally open contact pair 312 to blower motor 82 which operates in conjunction with a running capacitor as shown. Finally, lines 304 and 306 extend through contactor pair or relay pair 314 to the heater coil components 316 and 318 which are shown coupled with fusable safety links. As before, a normally closed contact pair 320 is coupled with the blower motor 82 to assure its energization at such time as the heater components 316 and 318 are energized. Those contacts 320 subsequently are opened in conjunction with the closure of contact pair 312.

Lines 300 and 302 extend to the primary side of a step down transformer 322, the output of which extends through a circuit breaker 324 to a terminal strip represented generally at 326. In this regard, line 328 is seen to extend through a normally open contact 330 which serves to activate the damper control 268 as an alternative to control or energization input from normally closed contact 266. Next, line 332 is seen extending to a relay coil 334, the energization of which carries out closure of blower contacts 312 and opening of contacts 320. Alternately, the input at line 332 may be directed to line 336 and relay coil 338 which function to actuate contact pairs 266, 296, 358 and 330. Next, a line 340 is seen extending from terminal strip 326 to a relay coil 342 functioning to selectively actuate contact pair 314. A line 344 is seen extending from terminal strip 326 and through a jumper 346 to high pressure cut-out switch 348 functioning in the same manner as switch 282. From switch 348, energization input is provided to a compressor short cycle time delay represented at block 350 and having the same function as block 284. The circuit then progresses as represented at line 352 to a low pressure cut-out switch 354 having the same function as switch 290 and thence to the compressor actuation relay coil 353 which corresponds to that at 286. As before, a low pressure by-pass function is provided as represented at block 355, that block having the same function as described in conjunction with block 292. Circuit 232 also employs the damper enable function 294 measuring ambient enthalpy or temperature. This feature is enabled by removal of jumper 346 and closure of contact pair 358 in consequence of the energization of coil 338. The leads containing contact pair 358 extend in parallel with those at contact pair 296.

Returning to FIG. 2, the mounting of circuits 230 and 232 within the apparatus 40 is revealed. This mounting is established so as to isolate the high voltage, more dangerous control components which are fed, for example, from power distribution lines 242, 244, and 304, 306. With such an arrangement, the servicing personnel can turn those systems off at either switches 236 or 298. In FIG. 2, one such high power distribution region is provided within a compartment represented in general at 363 and extending between the floor 64 and a shelf 364. This higher level compartment houses the high voltage components of main circuit 230. Spaced from compartment 362 is a corresponding compartment 366 retaining, for example, the same components but of the secondary circuit 232. Between compartments 362 and 366 is a compartment 368 extending above a shelf 370 which incorporates the low voltage control for both circuits as they exist from the secondary sides of step-down transformers 260 and 322. Those components essentially pose no particular hazard to servicing personnel. Each of the terminal strips as described at 262 and 326 in FIG. 7 are present within the intermediate low voltage region or compartment 368 as seen in FIG. 2.

In installing the apparatus 40 upon the enclosure 10, any of a number of control schemes may be employed through the simple expedient of connection with appropriate terminals of terminal strips 262 and 326. A more elementary form of such control which remains reasonably popular involves the expedient of installing two thermostats within the enclosure 12. Each thermostat is associated with one unique terminal strip. By establishing a running temperature point for one thermostat and an alarm level higher temperature point for the second thermostat, the temperature within enclosure 12 itself will effect a control wherein, as temperature rises above the running temperature point by a certain amount, the assumption is made that one air conditioning entity is disabled or overloaded. As the temperature reaches an alarm level, then the second air conditioning entity is activated. Of course, such an arrangement also serves to create a supplementary air conditioning capability with the second entity turning on in conjunction and jointly running with the first air conditioning entity for unusually encountered heat loads. Control logic for the system may vary from such relatively primitive techniques to highly sophisticated logic systems.

Since certain changes may be made in the above system and apparatus without departing from the scope of the invention herein involved, it is intended that all matter contained in the above description or shown in the accompanying drawings shall be interpreted as illustrative and not in a limiting sense.

We claim:

1. In a communications system having a ground supported enclosure for retaining electronic equipment exhibiting a given heat load and having a wall with an air transfer port for cooperating with an air conditioning system, the improved air conditioning apparatus comprising:

a conditioned air housing mountable upon said wall having a blower chamber located adjacent said air transfer port;

a condenser system housing mountable upon said wall;

first and second air circulation blowers mounted within said blower chamber having respective first and second blower input ports located within said blower chamber and respective first and second blower air output ports positioned in air input communication with said wall air transfer port;

first and second motors selectively energizable to drive respective said first and second blower air circulation blowers to transfer air from said blower chamber through said air transfer port while effecting an air pressure drop at said blower chamber;

first and second dampers pivotally mounted at respective said first and second output ports, said first blower damper having a closed orientation blocking air transfer from said enclosure through said first blower air output port when said first motor is de-energized and said second motor is energized and having an open orientation when said first motor is energized, said second damper having a closed orientation blocking air transfer from said enclosure through said second blower air output port when said second motor is de-energized and said first motor is energized and having an open orientation when said second motor is energized, said first and second dampers being freely mounted at respective said first and second output ports for swinging movement derived by air from said blower air output ports and said air pressure drop, about a substantially vertical axis;

a first refrigeration circuit having a first condenser coil, a first expansion device, a first compressor energizable to compress refrigerant, and a first evaporator coil, said first evaporator coil being located within said blower chamber in heat transfer association with air passing from said enclosure through said air transfer port, and said first condenser coil, being located within said condenser system housing;

a first condenser fan located within said condenser system housing;

a third motor located within said condenser system housing and energizable to drive said first condenser fan to effect passage of ambient air across said first condenser coil;

a second refrigeration circuit having a second condenser coil, a second expansion device, a second compressor energizable to compress refrigerant, and a second evaporator coil, said second evaporator coil being located within said blower chamber in heat transfer association with air passing through said air transfer port, and said second condenser coil being located within said condenser system housing;

a second condenser fan located within said condenser system housing;

a fourth motor located within said condenser system housing and energizable to drive said second condenser fan to effect passage of ambient air across said second condenser coil; and a control system responsive to an applied source of power for energizing said first and third motors and said first compressor, and responsive to an alarm condition to energize said second and fourth motors and said second compressor.

2. The air conditioning apparatus of claim 1 in which said conditioned air housing and said condenser system housing are positioned in mutually close adjacency.

3. The air conditioning apparatus of claim 2 including:

a first ambient air access opening located within said conditioned air housing without said blower chamber;

a second ambient air access opening located within said blower chamber;

a return air opening located within said conditioned air housing without said blower chamber in return air transfer communication with said condenser system housing;

an ambient air damper movably mounted within said conditioned air housing for movement between a closed orientation blocking said second ambient air access opening and said return air opening and open orientations defining an ambient air input path extending between said first ambient air access opening and said second ambient air access opening and further defining a return air path extending from said first and second evaporator coils, through said return air opening and into said condenser system housing;

a damper motor responsive to a control input to effect movement of said ambient air damper; and said control system is responsive in the presence of a predetermined temperature level of said ambient air to de-energize said third motor and said first compressor, to energize said fast motor and to provide said control input to said damper motor.

4. The air conditioning apparatus of claim 1 in which said evaporator coil is mounted in internested relationship with said first evaporator coil and including heat transfer fins in common connection with said first and second evaporator coils.

5. In a communications system having a ground supported enclosure for retaining electronic equipment exhibiting a given heat load and having a wall with an air transfer port for cooperating with an air conditioning system, the improved air conditioning apparatus comprising:

a conditioned air housing mounted upon said wall having a blower chamber located adjacent said air transfer port;

a condenser system housing mounted upon said wall in mutually close adjacency with said conditioned air housing;

first and second air circulation blowers mounted within said blower chamber, having respective first and second blower input ports and respective first and second blower output ports positioned in air input communication with said wall air transfer port;

first and second motors selectively energizable to drive respective said first and second air circulation blowers;

a first refrigeration circuit having a first condenser coil, a first expansion valve, a first compressor energizable to compress refrigerant, and a first evaporator coil, said first evaporator coil being located adjacent said air transfer port at said blower chamber, and said first condenser coil and said first compressor being located in said condenser system housing;

a first condenser fan located within said condenser system housing a third motor located at said condenser system housing and energizable to drive said first condenser fan to effect passage of ambient air across said first condenser coil;

a second refrigeration circuit having a second condenser coil, a second expansion valve, a second compressor energizable to compress refrigerant, and a second evaporator coil, said second evaporator coil being located adjacent said air transfer port at said blower chamber in internested relationship with said first evaporator coil and including heat transfer fins in common connection with said first and second evaporator coils;

a second condenser fan located at said condenser system housing;

a fourth motor located within said condenser system housing and energizable to drive said second condenser fan to effect passage of ambient air across said second condenser coil;

said condenser system housing being configured having first and second mutually isolated regions;

said first condenser coil, said first compressor and said third motor being located within said first region;

said second condenser coil, said second compressor, and said fourth motor being located within said second region; and a control system responsive to an applied source of power for energizing said fast and third motors and said first compressor, and responsive to an alarm condition to energize said second and fourth motors and said second compressor.

6. The air conditioning apparatus of claim 5 including:

a first ambient air access opening located within said conditioned air housing without said blower chamber;

a second ambient air access opening located within said blower chamber;

a return air opening located within said conditioned air housing without said blower chamber in return air transfer communication with said condenser system housing;

an ambient air damper movably mounted within said conditioned air housing for movement between a closed orientation blocking said second ambient air access opening and said return air opening and open orientations defining an ambient air input path extending between said first ambient air access opening and said second ambient air access opening, and further defining a return air path extending from said first and second evaporator coils, through said return air opening and into said condenser system housing;

a damper motor responsive to a control input to effect movement of said ambient air damper; and said control system is responsive in the presence of a predetermined temperature level of said ambient air to de-energize said third motor and said first compressor to energize said fast motor and to provide said control input to said damper motor.

7. In a communications system having a ground supported enclosure for retaining electronic equipment exhibiting a given heat load and having a wall with an air transfer port for cooperating with an air conditioning system, the improved air conditioning apparatus comprising:

a conditioned air housing mountable upon said wall having a blower chamber located adjacent said air transfer port;

a condenser system housing mountable upon said wall and having first and second mutually isolated regions;

first and second air circulation blowers mounted within said blower chamber, having respective first and second input ports and respective first and second output ports positioned in air input communication with said wall air transfer port;

first and second motors selectively energizable to drive respective said first and second air circulation blowers;

a first refrigeration circuit having a first condenser coil, a first expansion valve, a first compressor energizable to compress refrigerant, and a first evaporator coil, said first evaporator coil being located adjacent said air transfer port at said blower chamber, and said first condenser coil and said first compressor being located at said first region of said condenser system housing;

a first condenser fan located at said first region of said condenser system housing;

a third motor located at said first region of said condenser system housing and energizable to drive said first condenser fan to effect passage of ambient air across said first condenser coil;

a second refrigerator circuit having a second condenser coil, a second expansion valve, a second compressor energizable to compress refrigerant, and a second evaporator coil, said second evaporator coil being located adjacent said air transfer port at said blower chamber, and said second condenser coil and said second compressor being located at said second region of said condenser system housing;

a second condenser fan located at said second region of said condenser system housing;

a fourth motor located at said second region of said condenser system housing and energizable to drive said second condenser fan to effect passage of ambient air across said second condenser coil; and a control system connectable with a source of power having a first power circuit including a first principal power switch actuable to enable passage of electrical current at drive voltage levels to said first and third motors and said first compressor, said first power circuit being mounted within a first maintenance accessible compartment, having a second power circuit including a second principal power switch actuable to enable passage of electrical current at said drive voltage levels to said second and fourth motors and said second compressor, said second power circuit being mounted within a second maintenance accessible compartment, a first control network operable at a control voltage level less than said drive voltage levels and including first actuator components responsive to first control inputs for selectively effecting the energization of said first compressor and said first and third motors, a second control network operable at a said control voltage level less than said drive voltage levels and including second actuation components responsive to second control inputs for selectively effecting the energization of said second compressor and said second and fourth motors, said first and second control networks being spaced from said first and second compartments.

8. The air conditioning apparatus of claim 7 in which said conditioned air housing and said condenser system housing are positioned in mutually close adjacency.

9. The air conditioning apparatus of claim 8 including:

a first ambient air access opening located within said conditioned air housing without said blower chamber;

a second ambient air access opening located within said blower chamber;

a return air opening located within said conditioned air housing without said blower chamber in return air transfer communication with said condenser system housing;

an ambient air damper movably mounted within said conditioned air housing for movement between a closed orientation blocking said second ambient air access opening and said return air opening and open orientations defining an ambient air input path from said first ambient air access opening and said second ambient air access opening and further defining a return air path extending from said first and second evaporator coils, said return air opening and into said condenser system housing;

a damper motor responsive to a control input to effect movement of said ambient air damper;

said control system is responsive in the presence of a predetermined temperature level of said ambient air to de-energize said third motor and said first compressor and to provide said control input to said damper motor.

10. The air conditioning apparatus of claim 7 in which said second evaporator coil is mounted in internested relationship with said first evaporator coil and including heat transfer fins in common connection with said first and second evaporator coils.

11. The air conditioning apparatus of claim 7 in which:

said first and second evaporator coils each include two discrete refrigeration conduit lines extending from respective first and second inputs;

said first and second expansion devices are coupled in refrigerant transfer relationship to respective said first and second inputs through respective first and second Y connections, one branch of each thereof being coupled with one said conduit line and another branch of each thereof being coupled with another said conduit line.

12. In a communications system having a ground supported enclosure for retaining electronic equipment exhibiting a given heat load and having a wall with an air transfer port for cooperating with an air conditioning system, the improved air conditioning apparatus comprising:

a conditioned air housing mountable upon said wall having a blower chamber located adjacent said air transfer port;

a condenser system housing mountable upon said wall;

first and second air circulation blowers mounted within said blower chamber having respective first and second blower input ports located within said blower chamber and respective first and second blower air output ports positioned in air input communication with said wall air transfer port;

first and second motors selectively energizable to drive respective said first and second air circulation blowers to transfer from said blower chamber through said air transfer port while effecting an air pressure drop at said blower chamber;

first and second dampers pivotally mounted at respective said first and second blower output ports, said first damper having a closed orientation blocking air transfer from said enclosure through said first blower air output port when said first motor is de-energized and said second motor is energized and having an open orientation when said first motor is energized, said second damper having a closed orientation blocking air transfer from said enclosure through said second blower air output port when said second motor is de-energized and said first motor is energized and having an open orientation when said second motor is energized, said first and second dampers being freely pivotally mounted at respective said first and second output ports for swinging movement about a horizontal axis located adjacent a lowermost surface of said first and second blower output ports, said swinging movement being effected by air from said blower output ports and said air pressure drop;

a first refrigeration circuit having a first condenser coil, a first expansion device, a first compressor energizable to compress refrigerant, and a first evaporator coil, said first evaporator coil being located within said blower chamber in heat transfer association with air passing from said enclosure through said air transfer port, and said first condenser coil, being located within said condenser system housing;

a first condenser fan located within said condenser system housing;

a third motor located within said condenser system housing and energizable to drive said first condenser fan to effect passage of ambient air across said first condenser coil;

a second refrigeration circuit having a second condenser coil, a second expansion device, a second compressor energizable to compress refrigerant, and a second evaporator coil, said second evaporator coil being located within said blower chamber in heat transfer association with air passing through said air transfer port, and said second condenser coil being located within said condenser system housing;

a second condenser fan located within said condenser system housing;

a fourth motor located within said condenser system housing and energizable to drive said second condenser fan to effect passage of ambient air across said second condenser coil; and a control system responsive to an applied source of power for energizing said first and third motors and said first compressor, and responsive to an alarm condition to energize said second and fourth motors and said second compressor.

13. In a communications system having a ground supported enclosure for retaining electronic equipment exhibiting a given heat load and having a wall with an air transfer port for cooperating with an air conditioning system, the improved air conditioning apparatus comprising:

a conditioned air and condenser system housing mountable upon said wall having a blower chamber located adjacent said air transfer port;

first and second air circulation blowers mounted within said blower chamber having respective first and second blower input ports located within said blower chamber and respective first and second blower air output ports positioned in air input communication with said wall air transfer port;

first and second motors selectively energizable to drive respective said first and second air circulation blowers to transfer air from said blower chamber through said air transfer port while effecting an air pressure drop at said blower chamber;

first and second motors selectively energizable to drive respective said first and second air circulation blowers to transfer air from said blower chamber through said air transfer port while effecting an air pressure drop at said blower chamber;

first and second dampers pivotally mounted at respective said first and second blower output ports, said first damper having a closed orientation blocking air transfer from said enclosure through said first blower air output port when said first motor is de-energized and said second motor is energized and having an open orientation when said first motor is energized, said second damper having a closed orientation blocking air transfer from said enclosure through said second blower air output port when said second motor is de-energized and said first motor is energized and having an open orientation when said second motor is energized;

a first refrigeration circuit having a first condenser coil, a first expansion device, a first compressor energizable to compress refrigerant, and a first evaporator coil, said first evaporator coil being located within said blower chamber in heat transfer association with air passing from said enclosure through said air transfer port, and said condenser coil being located within said condenser system housing;

a first condenser fan located within a first condenser system portion of said housing;

a third motor located within said first portion and energizable to drive said first condenser fan to effect passage of ambient air across said first condenser coil;

a second refrigeration circuit having a second condenser coil, a second expansion device, a second compressor energizable to compress refrigerant, and a second evaporator coil, said second evaporator coil being located within said blower chamber in heat transfer association with air passing through said air transfer port, and said second condenser coil being located within said condenser system housing;

a second condenser fan located within a second condenser system portion of said housing;

a fourth motor located within said second portion and energizable to drive said second condenser fan to effect passage of ambient air across said second condenser coil; and a control system responsive to an applied source of power for energizing said first and third motors and said first compressor, and responsive to an alarm condition to energize said second and fourth motors and said second compressor, said control system including a first power circuit including a first principal power switch actuable to enable passage of electrical current at drive voltage levels to said first and third motors and said first compressor, said first power circuit being mounted within a first maintenance accessible compartment within said housing, having a second power circuit including a second principal power switch actuable to enable passage of electrical current at said drive voltage levels to said second and fourth motors and said second compressor, said second power circuit being mounted within a second maintenance accessible compartment within said housing, a first control network operable at a control voltage level less than said drive voltage levels and including first actuator components responsive to first control inputs for selectively effecting the energization of said first compressor and said first and third motors, a second control network operable at a said control voltage level less than said drive voltage levels and including second actuation components responsive to second control inputs for selectively effecting the energization of said second compressor and said second and fourth motors, said first and second control networks being mounted within said housing spaced from said first and second compartments.

14. In a communications system having a ground supported enclosure for retaining electronic equipment exhibiting a given heat load and having a wall with an air transfer port for cooperating with an air conditioning system, the improved air conditioning apparatus comprising:

a conditioned air housing mountable upon said wall having a blower chamber located adjacent said air transfer port;

a condenser system housing mountable upon said wall;

first and second air circulation blowers mounted within said blower chamber having respective first and second blower input ports located within said blower chamber and respective first and second blower air output ports positioned in air input communication with said wall air transfer port;

first and second motors selectively energizable to drive respective said first and second air circulation blowers to transfer air from said blower chamber through said air transfer port while effecting an air pressure drop at said blower chamber;

first and second dampers pivotally mounted at respective said first and second blower output ports, said first damper having a closed orientation blocking air transfer from said enclosure through said first blower air output port when said first motor is de-energized and said second motor is energized and having an open orientation when said first motor is energized, said second damper having a closed orientation blocking air transfer from said enclosure through said second blower air output pot when said second motor is de-energized and said first motor is energized and having an open orientation when said second motor is energized;

a first refrigeration circuit having a first condenser coil, a first expansion device, a first compressor energizable to compress refrigerant, and a first evaporator coil, said first evaporator coil being located within said blower chamber in heat transfer association with air passing from said enclosure through said air transfer port, and said first condenser coil, being located within said condenser system housing;

a first condenser fan located within said condenser system housing;

a third motor located within said condenser system housing and energizable to drive said first condenser fan to effect passage of ambient air across said first condenser coil;

a second refrigeration circuit having a second condenser coil, a second expansion device, a second compressor energizable to compress refrigerant, and a second evaporator coil, said second evaporator coil being located within said blower chamber in heat transfer association with air passing through said air transfer port, and said second condenser coil being located within said condenser system housing;

said first and second evaporator coils each including two discrete refrigeration conduit lines extending from respective first and second inputs;

said first and second expansion devices being coupled in refrigerant transfer relationship to respective said first and second inputs through respective first and second Y connections, one branch of each thereof being coupled with one said conduit line and another branch of each thereof being coupled with another said conduit line;

a second condenser fan located within said condenser system housing;

a fourth motor located within said condenser system housing and energizable to drive said second condenser fan to effect passage of ambient air across said second condenser coil; and a control system responsive to an applied source of power for energizing said first and third motors and said first compressor, and responsive to an alarm condition to energize said second and fourth motors and said second compressor.

15. In a communicatons system having a ground supported enclosure for retaining electronic equipment exhibiting a given heat load and having a wall with an air transfer port for cooperating with an air condition system, the improved air conditioning apparatus comprising:

a conditioned air and condenser system housing mounted upon said wall having a blower chamber located adjacent said air transfer port;

first and second air circulation blowers mounted within said blower chamber, having respective first and second blower input ports and respective first and second blower output ports positioned in air input communication with said wall air transfer port;

first and second motors selectively energizable to drive respective said first and second air circulation blowers;

a first refrigeration circuit having a first condenser coil, a first expansion valve, a first compressor energizable to compress refrigerant, and a first evaporator coil, said first evaporator coil being located adjacent said air transfer port at said blower chamber, and said first condenser coil and said first compressor being located in said condenser system housing;

a first condenser fan located within a first condenser system portion of said housing;

a third motor located at said first portion and energizable to drive said first condenser fan to effect passage of ambient air across said first condenser coil;

a second refrigeration circuit having a second condenser coil, a second expansion valve, a second compressor energizable to compress refrigerant, and a second evaporator coil, said second evaporator coil being located adjacent said air transfer port at said blower chamber in internested relationship with said first evaporator coil and including heat transfer fins in common connection with said first and second evaporator coils;

a second condenser fan located at a second condenser system portion of said housing;

a fourth motor located within said second portion and energizable to drive said second condenser fan to effect passage of ambient air across said second condenser coil;

a control system responsive to an applied source of power for energizing said first and third motors and said first compressor, and responsive to an alarm condition to energize said second and fourth motors and said second compressor, said control system including a first power circuit including a first principal power switch actuable to enable passage of electrical current at drive voltage levels to said first and third motors and said first compressor, said first power circuit being mounted within a first maintenance accessible compartment within said housing, having a second power circuit including a second principal power switch actuable to enable passage of electrical current at said drive voltage levels to said second and fourth motors and said compressor, said second power circuit being mounted within a second maintenance accessible compartment within said housing, a first control network operable at a control voltage level less than said drive voltage levels and including first actuator components responsive to first control inputs for selectively effecting the energization of said first compressor and said first and third motors, a second control network operable at a said control voltage level less than said drive voltage levels and including second actuation components responsive to second control inputs for selectively effecting the energization of said second compressor and said second and fourth motors, said first and second control networks being mounted within said housing spaced from said first and second compartments.

16. In a communications system having a ground supported enclosure for retaining electronic equipment exhibiting a given heat load and having a wall with an air transfer port for cooperating with an air conditioning system, the improved air conditioning apparatus comprising:

a conditioned air housing mounted upon said wall having and lower chamber located adjacent said air transfer port;

a condenser system housing mounted upon said wall;

first and second air circulation blowers mounted within said blower chamber, having respective first and second blower input ports and respective first and second blower output ports positioned in air input communication with said wall air transfer port;

first and second motors selectively energizable to drive respective first and second blower output ports positioned in air input communication with said wall air transfer first and second motors selectively energizable to drive respective said first and second air circulation blowers;

a first refrigeration circuit having a first condenser coil, a first expansion valve, a first compressor energizable to compress refrigerant, and a first evaporator coil, said first evaporator coil being located adjacent said air transfer port at said blower chamber, and said first condenser coil and said first compressor being located in said condenser system housing;

a first condenser fan located within said condenser system housing;

a third motor located at said condenser system housing and energizable to drive said first condenser fan to effect passage of ambient air across said first condenser coil;

a second refrigeration circuit having a second condenser coil, a second expansion valve, a second compressor energizable to compress refrigerant, and a second evaporator coil, said second evaporator coil being located adjacent said air transfer port at said blower chamber in internested relationship with said first evaporator coil and including heat transfer fins in common connection with said first and second evaporator coils;

said first and second evaporator coils each include two discrete refrigeration conduit lines extending from respective first and second inputs;

said first and second expansion valves are coupled in refrigerant transfer relationonship to respective said first and second inputs through respective first and second Y connections, one branch of each thereof being coupled with one said conduit line and another branch of each thereof being coupled with another said conduit line;

a second condenser fan located at said condenser system housing;

a fourth motor located within said condenser system housing and energizable to drive said second condenser fan to effect passage of ambient air across said second condenser coil; and a control system responsive to an applied source of power for energizing said first and third motors and said first compressor, and responsive to an alarm condition to energize said second and fourth motors and said second compressor.

* * * * *